United States Patent [19]

Shieu et al.

[11] 4,124,808

[45] Nov. 7, 1978

[54] MOS ON-CHIP VOLTAGE SENSE AMPLIFIER CIRCUIT

[75] Inventors: Mark S. D. Shieu, San Jose; Ronald C. Laugesen, Sunnyvale; Robert C. Dobkin, Hillsborough, all of Calif.

[73] Assignee: National Semiconductor Corporation, Santa Clara, Calif.

[21] Appl. No.: 763,380

[22] Filed: Jan. 28, 1977

[51] Int. Cl.² .......................... H03K 1/02; H03K 5/18
[52] U.S. Cl. .................................. 307/362; 307/304; 307/DIG. 3
[58] Field of Search ............... 307/290, 304, 350, 354, 307/362, 363, DIG. 1, DIG. 3, 296, 303

[56] References Cited

U.S. PATENT DOCUMENTS 3,806,741   4/1974   Smith .................................. 307/304

Primary Examiner—John Zazworsky
Attorney, Agent, or Firm—Gail W. Woodward

[57] ABSTRACT

A comparator amplifier circuit is integrated in MOS form. A sense amplifier section is coupled to a buffer amplifier section to provide an output that changes sharply at a particular voltage input. A compensating amplifier section is coupled between the comparator amplifier and a node in the buffer amplifier so that the voltage sense is independent of integrated circuit manufacturing variables.

5 Claims, 1 Drawing Figure

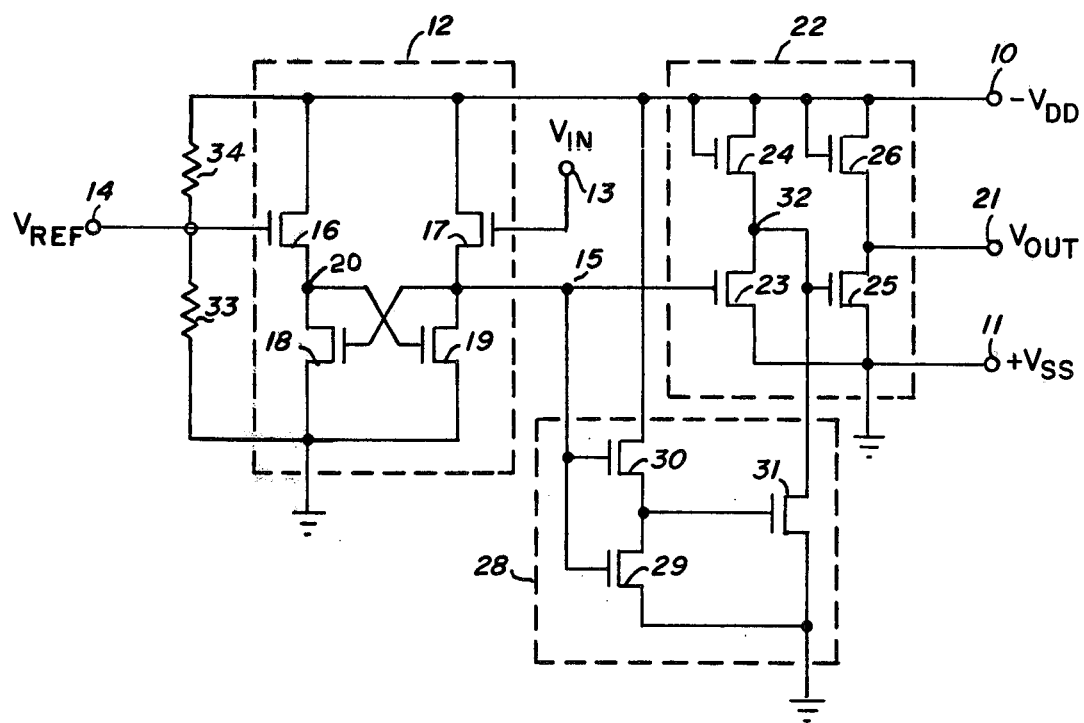

MOS ON-CHIP VOLTAGE SENSE AMPLIFIER CIRCUIT

BACKGROUND OF THE INVENTION

In MOS technology it has proven economical to incorporate as many functions as possible into a single semiconductor chip thereby to reduce dependence upon external components. Unfortunately even the best MOS processes result in substantial variation in device parameters. Accordingly, in circuits where performance is related to particular device parameters, either the critical circuits are manufactured external to the MOS chip or some form of external compensation is applied. Alternatively extremely careful process controls must be used in manufacturing if low chip yield is to be avoided. Such controls are expensive and are particularly undesirable where the critical circuit involves only a small portion of the MOS circuit.

Voltage sense amplifier circuits have proven particularly difficult to integrate into MOS chips. In such a circuit an output is made to change from one level to another as the input varies past a particular, or sense, level. Thus, in effect, an analog to digital conversion is employed. The output is digital, either a one or a zero, whereas the input is analog in that it can be any value. When such amplifiers are manufactured in MOS form, it is found that the input level, at which the output switches between digital states, will vary as a function of MOS process variables. Thus the voltage being sensed is not a reliable absolute value as is normally desired.

SUMMARY OF THE INVENTON

It is an object of the invention to integrate a voltage sense amplifier into an MOS chip.

It is a further object of the invention to provide a compensating section in a voltage sense amplifier circuit to compensate the MOS process variables so that the voltage sense level is independent of the MOS process variables.

These and other objects are achieved in a circuit configured in the following manner. A comparator amplifier section having two inputs operated in a differential mode has its output coupled to a buffer amplifier section which drives an output terminal. One comparator amplifier input is provided with a reference potential so that when the other input is provided with an analog voltage the output terminal will be at logic one or zero depending upon whether the input potential is above or below the reference potential. A compensating amplifier section is coupled between the output of the comparator amplifier section and a point in the buffer amplifier section so that the variations in the MOS process that produce device parameter variations are compensated. This results in a constant voltage sense level.

BRIEF DESCRIPTION OF THE DRAWING

The single FIGURE of drawing is a schematic diagram of the circuit of the invention.

DESCRIPTION OF THE INVENTION

In the circuit of the drawing all of the MOS transistors are of the p-channel enhancement variety. Accordingly $-V_{DD}$ is applied to power supply terminal 10 while terminal 11 is connected to $+V_{SS}$ which is referenced as ground.

A comparator amplifier section, shown inside dashed outline 12, has two inputs 13 and 14 and an output at node 15. Terminal 13 is labeled $V_{IN}$ and terminal 14 labeled $V_{REF}$ to represent input and reference potential points respectively. Transistors 16-19 comprise comparator amplifier 12. In regard to input terminal 13, transistor 17 acts as a common drain amplifier which has load transistor 19 bootstrapped by way of transistor 18. It can be seen that the potential at $V_{IN}$ drops below the potential at $V_{REF}$ (becomes more negative) node 15 will follow, thereby increasing conduction in transistor 18. This causes the potential at node 20 to increase (become more positive). This in turn will decrease conduction in transistor 19 to force node 15 still more negative. As a practical matter the voltage gain between terminal 13 and terminal 15 can be several times, a four to one ratio (or gain) being useful.

The output of comparator amplifier 12 is coupled to a buffer amplifier section shown inside dashed outline 22. Thus node 15 is the input of buffer amplifier 22, the output of which is coupled to terminal 21 where the circuit output appears. Buffer amplifier 22 is a two-stage non-inverting amplifier employing transistors 23-26. Transistors 24 and 26 are load devices suitably ratioed with respect to active amplifier devices 23 and 25 to provide the desired circuit performance characteristics. Devices 25 and 26 employ a large ratio to provide high gain and good limiting. Devices 23 and 24 are ratioed for moderate gain and to limit at the desired level.

It can be seen that if the potential at node 15 is less than one threshold, $V_T$, transistor 23 will be turned off. As node 15 falls below one threshold, transistor 23 will be turned on. An additional small increment will drive the circuit into limiting. This action is due to the moderately large ratio between transistors 23 and 24. Since comparator amplifier 12 has a gain of about 4, a very small increment in potential at terminal 13 will drive transistor 23 from cutoff to limiting, thus ensuring digital behavior at the circuit output. Transistors 25 and 26 have a very large ratio and act to further square up the digital operation and provide the signal characteristics desired at terminal 21.

From the above it can be seen that when $V_{IN}$ is more negative than than $V_{REF}$, $V_{OUT}$ at terminal 21 will be about $V_T$ below $V_{DD}$. When $V_{IN}$ is more positive than $V_{REF}$, $V_{OUT}$ will be close to ground potential. This corresponds to a logic one and a logic zero respectively.

Since the turn on of transistor 23 sets the operating point of the circuit, it is clear that the circuit thus far described will have a sense potential that will vary with the fabrication process variables. It is well known that such factors as $V_T$, body effect, mobility, and lateral diffusion, vary with the process so that any circuit characteristic linked with these variables will produce circuit performance variation. In a voltage sense amplifier circuit the variation in sense potential with process is the most troublesome.

To avoid the process variables changing the sense potential a compensating amplifier section, shown inside the dashed outline 28, is connected as shown. Transistors 29-31 comprise compensating amplifier 28. The input is taken from node 15 and the output is coupled to amplifier 22, specifically node 32 as shown. Node 32 is the interstage point of buffer amplifier 22. The connection is such that transistor 31 source-drain circuit parallels that of transistor 23. Transistors 29 and 30 have their gates coupled in parallel to node 15 and their source-drain circuit in series across the power supply $V_{DD}$-$V_{SS}$. As node 15 is driven negative with respect to ground, transistors 29 and 30 will be turned on when the negative potential at node 15 drops below one threshold. These transistors are ratioed so that transistor 30 is more conductive than transistor 29 and has much more gain. Thus when the potential at node 15 drops to slightly more than $2V_T$ with respect to ground, transistor 31 will be turned on. As node 15 becomes still more negative, the conduction in transistor 31 will increase proportionally. When transistor 31 is turned on the gain of transistor 23 will be reduced. By controlling the ratio between transistors 23 and 31, the amount of gain reduction (or the gain of compensating amplifier 28) can be controlled. Typically in design the parameters are adjusted so that the highest acceptable value of $V_T$ is such that transistor 31 never comes on. Then as $V_T$ decreases, as a function of the MOS processes, the conduction of transistor 31 will increase with the parameter fall such that the level of $V_{IN}$ for the output transition will be constant.

EXAMPLE

The following chart shows a successful circuit design in terms of the MOS transistors. In the numbers the fractions represent the channel width/length values in mils.

| Transistor | W/L (mils) |
|---|---|
| 16 – 19 | .6/.6 |
| 23 | 1.5/.6 |
| 24 | .4/.6 |
| 25 | .5/.6 |
| 26 | .3/5 |
| 29 | .2/.6 |
| 30 | 1/.3 |
| 31 | 1.4/.6 |

In a practical simulation of the circuit of the drawing using transistors of the size shown above, $V_{REF}$ was established at about 2.5% positive with respect to $V_{DD}$ by employing resistors 34 and 33. The resistors had a ratio of 1 to 39. $V_T$ was varied over the range of 0.9 to 2.3 volts, Beta over the range of 4.3 to 8.7, $M_S$ at 0.3 and 0.7, $M_L$ at 0.5 and 0.85, and LATD at 0.16 and 0.08. Where Beta is the transistor gain in micromhos per volt, $M_S$ is the short channel device body effect factor in volts$^{\frac{1}{2}}$, $M_L$ is the long channel body effect factor in volts$^{\frac{1}{2}}$, and LATD is the total lateral diffusion in the process in mils. In terms of channel length anything over 0.6 mil is regarded as long. These parameters and the simulated values are well known in the MOS art and are representative of conventional p-channel device manufacturing.

The following chart shows the results of the simulation. $V_{IN}$ is the voltage at which the output transition occurs for four sets of conditions, at three values of $V_{DD}$.

| $V_{DD}$ | $V_T$ | $M_S$ | $M_L$ | Beta | LAID | $V_{IN}$ |
|---|---|---|---|---|---|---|
| 9.5 | 0.9 | 0.3 | 0.5 | 5.3 | 0.16 | 9.31 |
| 9.5 | 2.3 | 0.7 | 0.85 | 7.2 | .08 | 9.31 |
| 9.5 | 2 | 0.7 | 0.85 | 4.3 | .08 | 9.3 |
| 9.5 | 1.2 | 0.3 | 0.5 | 8.7 | 0.16 | 9.26 |
| 7.9 | 0.9 | 0.3 | 0.5 | 5.3 | 0.16 | 7.74 |
| 7.9 | 2.3 | 0.7 | 0.85 | 7.2 | .08 | 7.76 |
| 7.9 | 2 | 0.7 | 0.85 | 4.3 | .08 | 7.75 |
| 7.9 | 1.2 | 0.7 | 0.5 | 8.7 | 0.16 | 7.73 |
| 6.5 | 0.9 | 0.3 | 0.5 | 5.3 | 0.16 | 6.37 |
| 6.5 | 2.3 | 0.7 | 0.85 | 7.2 | .08 | 6.39 |
| 6.5 | 2 | 0.7 | 0.85 | 4.3 | .08 | 6.38 |
| 6.5 | 1.2 | 0.3 | 0.5 | 8.7 | 0.16 | 6.36 |

The above chart shows that even with the use of worst case design parameters in terms of process variables, the value of $V_{IN}$ for the output transition varies less than 0.5%.

The invention has been described and a particular embodiment detailed but there are alternatives and equivalents that will occur to a person skilled in the art. For example, while a p-channel device embodiment is shown, it is obvious that N-channel devices could be used. In this case all potential polarities would be reversed. Accordingly, it is intended that the invention be limited only by the claims that follow.

We claim:

1. An integrated MOS voltage sense amplifier circuit having the property of switching an output between high and low states in response to the relation between an input voltage and a reference voltage, said circuit comprising:
   comparator amplifier means having two voltage responsive input terminals and a single output terminal, the voltage level at said output terminal being a function of the difference in voltage levels at said input terminals and MOS process variables;
   buffer amplifier means having an input terminal coupled to said comparator amplifier means output terminal and an output terminal defining said output of said circuit; and
   compensating amplifier means having an input coupled to said comparator amplifier means output terminal and an output coupled to a node in said buffer amplifier means, said compensating amplifier means having an output conduction proportional to its input voltage whereby said circuit output switches as a function of the difference in voltage levels at said input terminals of said comparator amplifier means independent of said process variables.

2. The circuit of claim 1 wherein said comparator amplifier means comprise:
   first and second MOS transistors having their source-drain circuits coupled in series across a source of operating potential, the gate of said first transistor being coupled to the voltage sense input terminal and the jucture of said source drain circuits constituting said sense amplifier means output terminal; and
   third and fourth MOS transistors having their source-drain circuits coupled in series across said source of operating potential, the gate of said third transistor being coupled to said reference voltage, the juncture of said source-drain circuits being coupled to the gate of said second transistor, and the gate of said second transistor being coupled to said juncture of said first and second transistor source-drain circuits.

3. The circuit of claim 2 wherein said first, second, third, and fourth MOS transistors are all the same size.

4. The circuit of claim 2 wherein said buffer amplifier and said compensating amplifier means means comprise:
   fifth and sixth MOS transistors having their source-drain circuits coupled in series across a source of operating potential, the juncture of said source-drain circuits constituting a node representing said output of said circuit, and the gate of said fifth transistor being coupled to its drain whereby said fifth transistor acts as a load element for said sixth transistor;

seventh and eighth MOS transistors having their source-drain circuits coupled in series across said source of operating potential, the juncture of said source-drain circuits being coupled to the gate of said sixth transistor, the gate of said seventh transistor being coupled to its drain whereby said seventh transistor being coupled to its drain whereby said seventh transistor acts as a load element for said eighth transistor, and the gate of said eighth transistor being coupled to said output terminal of said comparator amplifier means;

ninth and tenth MOS transistors having their source-drain circuits coupled in series across said source of operating potential, and their gates coupled together and to said output terminal of said comparator amplifier means; and an eleventh MOS transistor having its source drain circuit coupled in parallel with the source-drain circuit of said eighth transistor and its gate coupled to the juncture of said source-drain circuits of said ninth and tenth transistors.

5. The circuit of claim 3 wherein a pair of resistors is coupled in series across said source of operating potential, the juncture of said resistors being coupled to said gate of said third transistor whereby said circuit senses a voltage that is a fraction of that of said source of operating potential independent of said process, said fraction being set by the values of said resistors.

* * * * *